United States Patent
Fujinaga et al.

(10) Patent No.: US 7,696,845 B2
(45) Date of Patent: Apr. 13, 2010

(54) DIELECTRIC FILTER FOR BASE STATION COMMUNICATION EQUIPMENT

(75) Inventors: Masataka Fujinaga, Mine (JP); Hiroshi Nakamura, Mine (JP); Yoshiaki Fujiyama, Mine (JP)

(73) Assignee: UBE Industries, Ltd., Yamaguchi (JP)

(*) Notice: Subject to any disclaimer, the term of this patent is extended or adjusted under 35 U.S.C. 154(b) by 59 days.

(21) Appl. No.: 11/917,062

(22) PCT Filed: Jun. 22, 2006

(86) PCT No.: PCT/JP2006/312476

§ 371 (c)(1),
(2), (4) Date: Dec. 10, 2007

(87) PCT Pub. No.: WO2006/137470

PCT Pub. Date: Dec. 28, 2006

(65) Prior Publication Data

US 2009/0108962 A1 Apr. 30, 2009

(30) Foreign Application Priority Data

Jun. 23, 2005 (JP) .............................. 2005-183973

(51) Int. Cl.
H01P 1/205 (2006.01)
(52) U.S. Cl. .................... 333/202; 333/206; 333/134
(58) Field of Classification Search ................ 333/202, 333/206, 134
See application file for complete search history.

(56) References Cited

U.S. PATENT DOCUMENTS 6,828,883 B1 * 12/2004 Kitajima et al. ............ 333/206

2002/0021188 A1 * 2/2002 Kono et al. ................ 333/134
2002/0021189 A1 * 2/2002 Kuroda et al. ............. 333/134
2003/0210112 A1 * 11/2003 Tada et al. ................. 333/206

FOREIGN PATENT DOCUMENTS

| JP | 59-500198 | 2/1984 |
|----|-----------|--------|
| JP | 61-262301 | 11/1986 |
| JP | 04-300243 | 10/1992 |
| JP | 06-501603 | 2/1994 |
| JP | 07-221502 | 8/1995 |
| JP | 2000-515336 | 11/2000 |
| JP | 2002-080273 | 3/2002 |
| JP | 2002-201062 | 7/2002 |
| JP | 2003-332807 | 11/2003 |

OTHER PUBLICATIONS

"Microwave Filters, Impedance—Matching Networks, and Coupling Structures" Sec. 8.13, Comb-Line, Band-Press Filters, McGraw-Hill 1964, pp. 497-506.

* cited by examiner

Primary Examiner—Benny Lee
(74) Attorney, Agent, or Firm—Frommer Lawrence & Haug LLP; Ronald R. Santucci

(57) ABSTRACT

In a dielectric filter (1) for base station communication equipment, a rectangular solid dielectric block (2) is provided with a plurality of ¼ wavelength resonators (3A1-3A4; 3B1-3B4), which are arranged along side planes (2c,2d) of the dielectric block and extend in parallel to each other and to the side planes (2c,2d). The dielectric block (2) is composed of dielectric ceramics having a relative dielectric constant of 5-20, and a size (H) in a direction orthogonally intersecting with the side planes (2c,2d) of the dielectric block (2) is 10-30 mm.

8 Claims, 6 Drawing Sheets

CENTER: 2055MHz SPAN: 600MHz
FREQUENCY

CENTER: 2055MHz SPAN: 600MHz
FREQUENCY

CENTER: 2055MHz SPAN: 600MHz
FREQUENCY

CENTER: 2055MHz SPAN: 600MHz
FREQUENCY

CENTER: 2055MHz SPAN: 600MHz
FREQUENCY

CENTER: 2055MHz SPAN: 600MHz
FREQUENCY

CENTER: 2055MHz SPAN: 600MHz
FREQUENCY

CENTER: 2055MHz SPAN: 600MHz
FREQUENCY

DIELECTRIC FILTER FOR BASE STATION COMMUNICATION EQUIPMENT

This application is a 371 of PCT/JP2006/312476 filed on Jun. 22, 2006, published on Dec. 28, 2006 under publication number WO 2006/137470 A which claims priority benefits from Japanese Patent Application No. 2005-183973 filed Jun. 23, 2005, the disclosure of which is hereby incorporated by reference.

TECHNICAL FIELD

The present invention relates to a dielectric filter for base station communication equipment using a dielectric block, which is suitable for use in a high frequency band such as a microwave band, and in particular, to a dielectric filter that can achieve a low loss without using a reentrant coaxial or cylindrical cavity resonator and is suitable for use in high power base station communication equipment.

BACKGROUND ART

A communication system such as a mobile phone or portable telephone utilizes a mobile terminal or portable terminal that is compact and lightweight and is suitable to be carried around, and fixed base station communication equipment for communication with each of the portable terminals. Most of radio waves used in most of the communication systems are classified into a frequency band for base station reception that is oscillated at and transmitted from the portable terminal and received at the base station communication equipment, and a frequency band for base station transmission that is oscillated at and transmitted from the base station communication equipment and received at the portable terminal. In either the portable terminal and the base station communication equipment, such devices separates radio waves so that a transmission signal and a reception signal do not interfere with each other by using a filter, and carries out signal processing with respect to each of the radio waves.

As the filter used in the portable terminal, there is a ceramic filter, as described in Patent Document 1, for example. Weight reduction and size reduction have been advanced for the portable terminal along with the advance of technology so as to be easily carried around, and the filter used therein has also been reduced in size.

On the other hand, in a base station side, due to a wide communication area, radio waves need to be radiated from an antenna by using high power communication equipment. For this reason, as a transmission side filter for the base station communication equipment, one with a low loss has been required in order to supply a high powers amplified by a semiconductor device and so on, to the antenna economically. In particular, in the transmission side filter, a configuration needs to be such that the temperature of the filter itself does not increase as a result of the generation of heat due to a loss by the filter.

For this reason, in the base station communication equipment, as described in Non-Patent Document 1 for example, a filter of a type that uses, as a resonant element, a metallic rod inserted in a metallic enclosure, which is so-called a reentrant coaxial or cylindrical cavity resonator. Such a filter has a low loss, and has good heat release and conductivity in order for the generated heat to be less likely to cause a temperature increase since the filter is composed of metal. However, the reentrant coaxial or cylindrical cavity resonator has a large size and is expensive.

In recent years, a communication system of high speed and large capacity has been achieved, and a communication system using 1.5 to 4 GHz as a communication frequency band has been provided. In such a communication system, in accordance with increases in the number of the portable terminals and in lines of the base station, there is a tendency that a wide area is covered by narrowing a communication area of one cell, and instead thereof, increasing the number of the cells. For this reason, the number of the base stations has also been increased. If one including the reentrant coaxial or cylindrical cavity resonator as described above is used for the filter of the communication equipment installed in a number of the base stations as described above, problems that the filter is large, heavy, and expensive and not suitable for mass production become apparent.

In view of the above problems, there has been a desire for a practical filter for the base station communication equipment that is compact and lightweight, and inexpensive and can be mass-produced easily, in place of the filter including the reentrant coaxial or cylindrical cavity resonator.

From the viewpoint of size reduction and weight reduction, it is preferable that dielectric ceramics having a high relative dielectric constant be used. That is, a dielectric resonator has a length in an axial direction substantially proportional to $1/(\text{relative dielectric constant})^{1/2}$, and the higher the relative dielectric constant becomes, the more a dimension in the axial direction becomes shortened. The reentrant coaxial or cylindrical cavity resonator is a ¼ wavelength dielectric resonator using air (having a relative dielectric constant of around 1) as a dielectric material, and a length in the axial direction of the reentrant coaxial or cylindrical cavity resonator having a resonance frequency at 2 GHz is 37.5 mm. On the other hand, a ¼ wavelength dielectric filter using dielectric ceramics having a relative dielectric constant 40 has a length in the axial direction of the resonator of 5.93 mm, and is shortened to around ⅙ of the length of the reentrant coaxial or cylindrical resonator.

As a filter for the base station communication equipment formed by using a block of dielectric ceramics for use in a communication system of a frequency band lower than 1 GHz, as described in Patent Document 2, for example. In a specific example shown there, a block of ceramics having a relative dielectric constant of 40 is used, and dimensions of the block is 77.6 mm in length, 11.74 in width, and 11.54 in height. A transmission frequency is 825 MHz through 845 MHz and a reception frequency is 870 MHz through 890 MHz, and as an electric characteristic, it is described that an insertion loss is 1.6 dB and a reception signal is attenuated for 55 dB. In addition, also in Patent Document 3, a dielectric filter using a block of ceramics having a relative dielectric constant of 40 is disclosed. Dimensions of the block is 81.3 mm in length, 30.0 mm in width, and 20.4 mm in height, and a transmission frequency is 453 MHz through 457.475 MHz and a reception frequency is 463 MHz through 467.475 MHz.

However, a practical dielectric filter for base station communication equipment that uses dielectric ceramics and is used in a frequency band equal to or higher than 1 GHz has not conventionally proposed.

Note that Patent Document 4 discloses dielectric ceramics having a high dielectric constant, a large Q, and a good temperature dependency characteristic of a resonance frequency as a material of a dielectric resonator used at a frequency band equal to or higher than 1 GHz. However, at a frequency band equal to or higher than 1 GHz, when a dielectric block composed of dielectric ceramics having a high dielectric constant is used, dimensional accuracy is strictly required for the dielectric block, and difficulty in processing increases, manufacturing cost increases, and it becomes impractical. In view of the above, as described in Patent Document 5 for example, it is suggested that dielectric ceramics having a relative dielectric constant of 10 to 20 is used to lower a dielectric loss, and also lower a temperature factor or coefficient of a resonance frequency. In addition, Patent Document 6 discloses dielectric ceramics having a relative dielectric constant equal to or lower than 20, a low temperature factor or coefficient of a resonance frequency, and a high Q value.

Patent Document 1: WO-A1-2000-515336
Patent Document 2: WO-A1-59-500198
Patent Document 3: JP-A-61-262301
Patent Document 4: JP-A-04-300243
Patent Document 5: JP-A-2002-201062
Patent Document 6: JP-A-2002-80273
Non-Patent Document 1: MICROWAVE FILTERS, IMPEDANCE-MATCHING NETWORKS, AND COUPLING STRUCTURES SEC. 8.13, COMB-LINE, BAND PASS FILTERS, McGraw-Hill 1964

SUMMARY OF THE INVENTION

Problems to be Solved by the Invention

As described in the above-mentioned Patent Document 2, even in a frequency band lower than 1 GHz, an insertion loss of a dielectric filter using dielectric ceramics is higher than 1.0 dB. For this reason, it has been unimaginable to configure a filter by using dielectric ceramics, which is used in a frequency band equal to or higher than 1 GHz, especially equal to or higher than 1.5 GHz, has a low insertion loss, and is suitable for use in high-power base station communication equipment. In the above-mentioned Patent Documents 4 to 6 as well, there is no reference of application thereof to a dielectric filter for base station communication equipment.

Further, with respect to a dielectric filter for base station communication equipment requiring high power, there is a problem that, as described above, a temperature rises and a temperature dependency characteristic is easily deteriorated. However, as described in the Patent Documents 4 to 6 described above, dielectric ceramics for a conventional dielectric filter is developed for the purpose of reducing a temperature factor of coefficient of a resonance frequency and increasing a material Q value, and heat conduction and heat release have not been considered.

The present invention is made in consideration of the problems as described above, and one object thereof is to provide a dielectric filter for base station communication equipment that is at a low loss, has less heat generation, is capable of high power, and is practical, without using the reentrant coaxial or cylindrical cavity resonator.

Another object of the present invention is to provide a dielectric filter for base station communication equipment that has a good heat release characteristic and is practical, without using the reentrant coaxial or cylindrical cavity resonator.

Means for Solving the Problems

According to the present invention, in order to achieves the above objects, there is provided a dielectric filter for base station communication equipment a dielectric filter for base station communication equipment suitable for use in a frequency band of 1.5 to 4 GHz, comprising:

a dielectric block of a substantially rectangular solid shape having a side surface;

a plurality of ¼ wavelength resonators, which are arranged along the side surface of the dielectric block, and extends so as to be substantially parallel to the side surface and substantially parallel to each other, wherein the dielectric block is made of dielectric ceramics having a relative dielectric constant of 5 to 20, and a dimension of the dielectric block in a direction orthogonally intersecting with the side surface of the dielectric block is 10 to 30 mm.

In an aspect of the present invention, an insertion loss of the dielectric filter is 0.8 dB or less. In an aspect of the present invention, an output of the dielectric filter is 10 to 50 W.

In an aspect of the present invention, the dielectric ceramics has a material Q value of 5000 or higher. In an aspect of the present invention, the dielectric ceramics has a thermal conductivity of 3 to 50 W/(m·K). In an aspect of the present invention, the dielectric ceramics has a specific heat of 600 J/(kg·K) or higher.

In an aspect of the present invention, the dielectric ceramics is alumina-based ceramics having a composition containing 40 mol % or more of $Al_2O_3$ as a major component. In an aspect of the present invention, the dielectric ceramics is alumina-based ceramics having, as a major component, a composition consisting of aluminum, zirconium, titanium, tin, and oxygen expressed by a composition formula $aAl_2O_3$-$bZrO_2$-$cTiO_2$-$dSnO_2$ (In the formula, $0.4068 < a < 0.9550$, $0 < b < 0.1483$, $0.0225 < c < 0.3263$, $0.0203 < d < 0.1186$, $a+b+c+d=1$).

Effects of the Invention

According to the present invention, a dielectric block made of dielectric ceramics having a relative dielectric constant of 5 to 20 and a dimension of the dielectric block in a direction orthogonally intersecting with the side surface of the dielectric block being 10 to 30 mm is used. Accordingly, there is provided a dielectric filter for base station communication equipment that is at a low loss, has less heat generation, is suitably used in a frequency band of 1.5 to 4 GHz, is capable of high power, and is practical.

That is, by forming a dielectric block of a substantially rectangular solid shape having specific dimensions by using dielectric ceramics having a specific characteristic, and by manufacturing a dielectric filter by using the dielectric block, a dielectric filter having a significantly improved insertion loss, restricted heat generation and good heat release can be obtained, even if a frequency used is high at 1.5 to 4 GHz. In this manner, a practical and compact dielectric filter for base station communication equipment can be provided without using a reentrant coaxial or cylindrical cavity resonator.

BRIEF DESCRIPTION OF THE DRAWINGS

In FIGS. 1 and 2, reference numeral 1 denotes a dielectric filter for base station communication equipment, 1A a reception side filter section, 1B a transmission side filter section, 2 a dielectric block, 2a a top surface, 2b a bottom surface, 2c a first side surface, 2d a second side surface, 2e a first end face, 2f a second end face, 3A1, 3A2, 3A3, 3A4, 3B1, 3B2, 3B3, 3B4 a ¼ wavelength resonator, 3AT, 3BT a trap resonator, 3PH a resonator for adjusting signal phase, 4 a through-hole, 5A1, 5A2, 5A3, 5A4, 5AT, 5B1, 5B2, 5B3, 5B4, 5BT, 5PH an inner conductor, 6 an outer conductor, 7A1, 7A2, 7A3, 7A4, 7AT, 7B1, 7B2, 7B3, 7B4, 7BT, 7PH a coupling conductor a 8X common input/output electrode, 8A, 8B an input/output electrode, 8AP, 8BP a patterned conductive film, and 9A a patterned conductive film.

BEST MODE FOR CARRYING OUT THE INVENTION

Hereinafter, a dielectric filter for base station communication equipment according to the present invention will be described with reference to the accompanying drawings.

Figure 1:
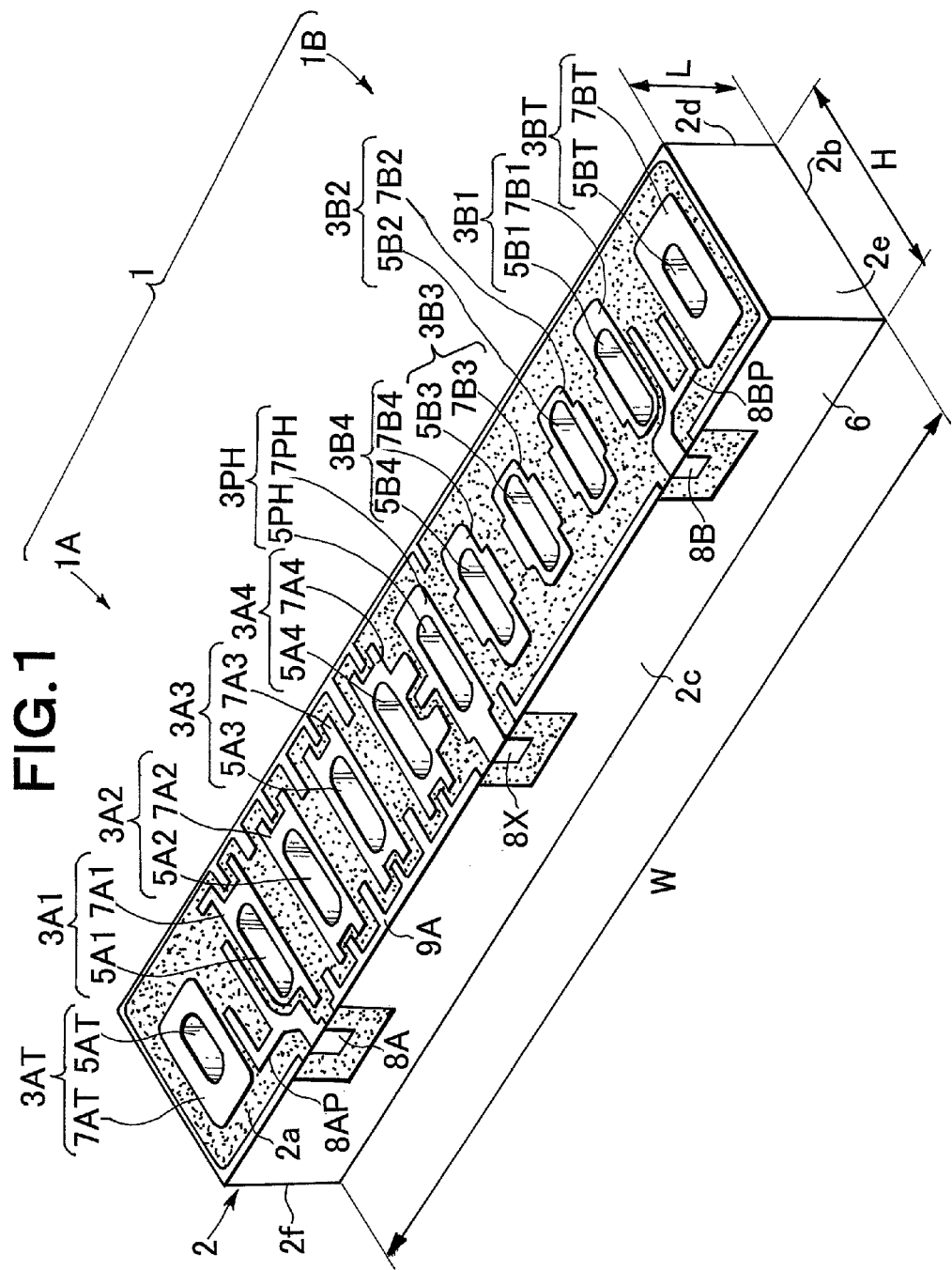
FIG. 1 is a perspective view showing an embodiment of the dielectric filter for base station communication equipment of the present invention.
Figure 2:
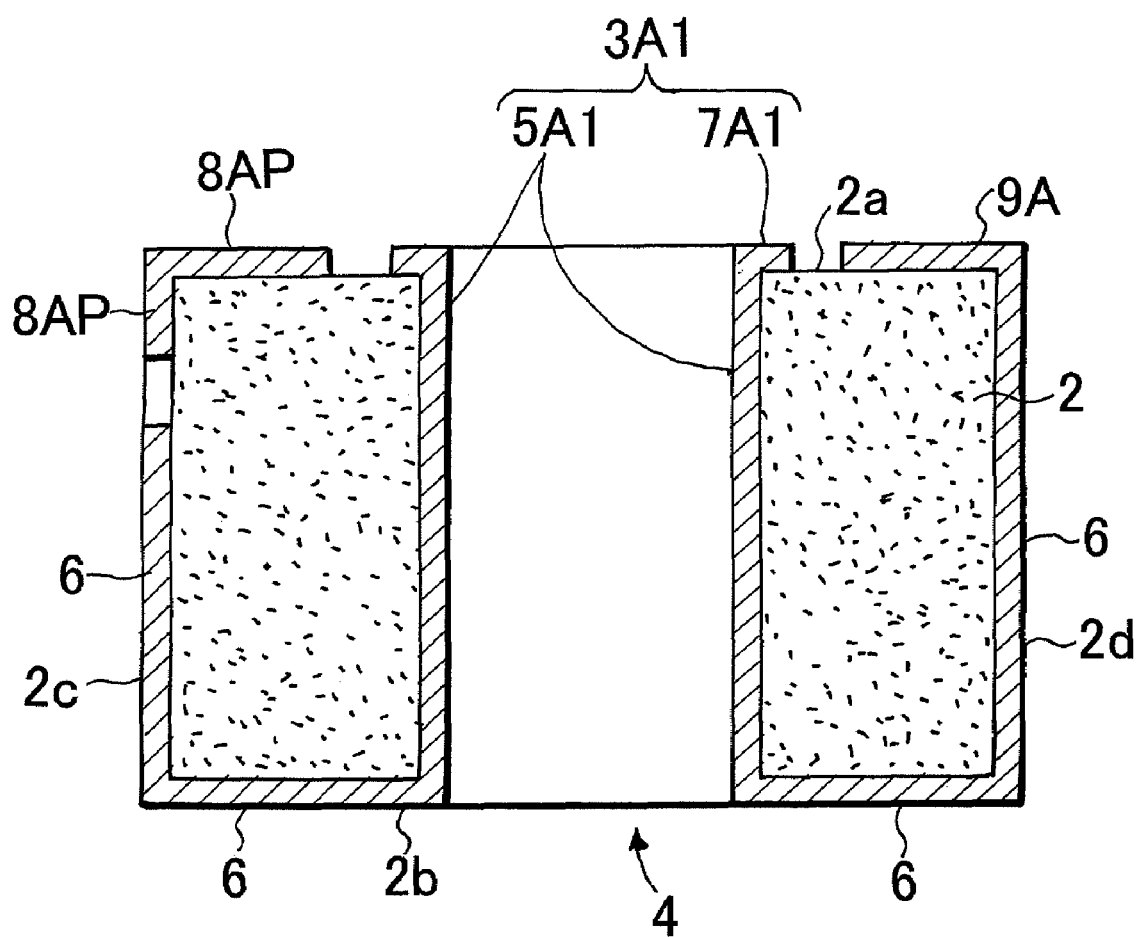
FIG. 2 is a cross-sectional view of the dielectric filter of FIG. 1.

FIG. 1 is a perspective view showing an embodiment of the dielectric filter for base station communication equipment of the present invention, and FIG. 2 is a cross-sectional view thereof. A dielectric filter 1 for base station communication equipment according to the present embodiment is the dielectric filter for base station communication equipment that is composed by forming a plurality of ¼ wavelength resonators (λ/4 resonators) on a dielectric block 2 having a substantially rectangular solid outer shape. More specifically, the dielectric filter 1 constitutes a duplexer including a reception side filter section 1A and a transmission side filter section 1B.

The dielectric block 2 has a top surface 2a and a bottom surface 2b that are parallel to and face each other, has a first side surface 2c and a second side surface 2d that orthogonally intersect with the top surface 2a and the bottom surface 2b and are parallel to each other, and has a first end face 2e and a second end face 2f that orthogonally intersect with the top and bottom surfaces 2a and 2b and the first and second side surfaces 2c and 2d, and are parallel to each other. The dielectric block 2 has a plurality of through-holes 4 (refer to FIG. 2) that pass through from the top surface 2a to the bottom surface 2b in a height direction formed thereon. In addition, an outer conductor 6 made of a conductive film is formed on outer planes or surfaces (the bottom surface 2b, the first and second side surfaces 2c and 2d, and the first and second end faces 2e and 2f) with the exception of the top surface 2a of the dielectric block 2.

A plurality (four in FIG. 1) of ¼ wavelength resonators 3A1, 3A2, 3A3 and 3A4, and a trap resonator 3AT are provided in the reception side filter section 1A. In addition, a plurality (four in FIG. 1) of ¼ wavelength resonators 3B1, 3B2, 3B3 and 3B4, and a trap resonator 3BT are provided in the transmission side filter section 1B. In addition, a resonator 3PH for adjusting a signal phase is formed between the reception side filter section 1A and the transmission side filter section 1B. These resonators are arranged along a length direction of the dielectric block 2 in an order of the resonator 3AT, the resonators 3A1, 3A2, 3A3 and 3A4, the resonator 3PH, the resonators 3B4, 3B3, 3B2 and 3B1, and the resonator 3BT.

Each of these resonators is formed for each of the through-holes 4. That is, as shown in FIG. 2, the resonator 3A1 includes an inner conductor 5A1 made of a conductive film formed in an inner wall surface of the through-hole 4, and the outer conductor 6 connected to the inner conductor 5A1 at a bottom end section of the through-hole 4. Other resonators are similar, and the resonators 3A2, 3A3, 3A4, 3AT, 3B1, 3B2, 3B3, 3B4, 3BT, and 3PH include inner conductors 5A2, 5A3, 5A4, 5AT, 5B1, 5B2, 5B3, 5B4, 5BT and 5PH, and the outer conductor 6 connected to the inner conductors 5A2, 5A3, 5A4, 5AT, 5B1, 5B2, 5B3, 5B4, 5BT and 5PH respectively as shown in FIG. 1 at a bottom end section of the through-holes 4.

On the top surface 2a of the dielectric block 2, there are formed coupling conductors 7A1, 7A2, 7A3, 7A4, 7AT, 7B1, 7B2, 7B3, 7B4, 7BT and 7PH made of patterned conductive films connected to the inner conductors 5A1, 5A2, 5A3, 5A4, 5AT, 5B1, 5B2, 5B3, 5B4, 5BT and 5PH of the resonators 3A1, 3A2, 3A3, 3A4, 3AT, 3B1, 3B2, 3B3, 3B4, 3BT and 3PH respectively as shown in FIG. 1.

The top surface 2a of the dielectric block 2 is called an open surface, since the inner conductor of each of the resonators is not connected to the outer conductor 6 on the top surface 2a. On the other hand, the bottom surface 2b of the dielectric block 2 is called a closed or short-circuited surface, since the inner conductor of each of the resonators is connected (short-circuited) to the outer conductor 6 on the bottom surface 2b.

As shown in FIG. 1, the first side surface 2c, there are formed a common input/output electrode 8X for the reception side filter section 1A and the transmission side filter section 1B, another input/output electrode 8A for the reception side filter section 1A pairing up with the common input/output electrode 8X, and another input/output electrode 8B for the transmission side filter section 1B pairing up with the common input/output electrode 8X, and each of these electrodes is formed spaced apart from the outer conductor 6. On the top surface 2a of the dielectric block 2, there is a patterned conductive film 8AP formed between the coupling conductor 7A1 of the resonator 3A1 and the coupling conductor 7AT of the resonator 3AT in the reception side filter section 1A, and the patterned conductive film 8AP is connected to the input/output electrode 8A. Similarly, there is a patterned conductive film 8BP formed between the coupling conductor 7B1 of the resonator 3B1 and the coupling conductor 7BT of the resonator 3BT in the transmission side filter section 1B, and the patterned conductive film 8BP is connected to the input/output electrode 8B. In addition, the coupling conductor 7PH of the resonator 3PH is connected to the common input/output electrode 8X.

The coupling conductors 7A1 to 7A4, 7AT, 7B1 to 7B4, 7BT and 7PH are used to couple the resonators adjacent to each other, or the resonator and the input/output electrode.

On the top surface 2a of the dielectric block 2, there is formed a patterned conductive film 9A, in the reception side filter section 1A, for adjusting coupling between each of the resonators belonging thereto, and the patterned conductive film 9A is connected with the outer conductor 6.

The dielectric filter is used after being surface-mounted on a mounting substrate by soldering, or the like. At that time, the first side surface 2c of the dielectric block 2 comes into contact with a mounting surface of the mounting substrate, terminals of an external circuit formed on the mounting surface of the mounting substrate are connected with the common input/output electrode 8X and the input/output electrodes 8A and 8B of the dielectric block 2, and an earth terminal formed on the mounting surface of the mounting substrate is connected with the outer conductor 6 of the dielectric block 2.

Dimensions and allocation of each of the resonators 3A1 to 3A4, 3AT, 3B1 to 3B4, 3BT and 3PH, and shapes of the coupling conductors 7A1 to 7A4, 7AT, 7B1 to 7B4, 7BT and 7PH, and further, a shape of the patterned conductive film 9A, and so on, are properly set. In this manner, the reception side filter section 1A and the transmission side filter section 1B having appropriate characteristics such as desired pass bands can be obtained.

Outside dimension of a substantially rectangular solid of the dielectric block 2 are expressed by a length W, a width H, and a height L, as shown in FIG. 1. That is, the length W is a dimension in a direction in which a plurality of the resonators are arranged in the dielectric block 2 (direction along the top and bottom surfaces 2a and 2b, and the first and second side surfaces 2c and 2d), the width H is a dimension in a direction (direction along the top and bottom surfaces 2a and 2b, and the first and second end faces 2e and 2f) perpendicular to a direction of the through-holes 4 (that is, an axis direction of the resonators) and also perpendicular to a direction in which a plurality of the resonators are arranged, and the height L is a dimension in a direction of the through-holes 4, that is, a distance between the top surface 2a and the bottom surface 2b.

The length W of the dielectric block 2 changes depending on the number of resonators, etc. In addition, the height L of the dielectric block 2 is properly set in accordance with a frequency used in the range of 1.5 to 4 GHz.

The width H of the dielectric block 2 is 10 to 30 mm. If the width H is smaller than 10 mm, there is a tendency that a no-load Q value of the resonator becomes low, an insertion loss of the filter becomes large, and also a temperature increase at the time of heat generation becomes large. In addition, as the width H becomes larger than 30 mm, increasing rates of the resonator no-load Q value by the width H and an improving effect of the filter insertion loss become small, while other losses (such as a radiation loss) become large, and as a result, there is a tendency that the no-load Q value of the resonator does not increase and the insertion loss of the filter is not lowered. This appears to be significant for one having a material Q value (so called f·Q (here, f is a resonance frequency)) of 5000 or more. That is, the present embodiment is especially effective in a case where the dielectric ceramics constituting the dielectric block 2 has a material Q value f·Q of 5000 or more. As one example, in case the dielectric block 2 made of the dielectric ceramics having a relative dielectric constant 13 and a material Q value of 45000, the resonator no-load Q value is around 800 when H=6.1 mm. However, if H=14.4 mm is obtained, the resonator no-load Q value becomes 1250, and if H=30 mm is obtained, the resonator no-load Q value becomes 1300. However, even if H=40 mm is obtained, the resonator no-load Q value is around 1300.

The dielectric block 2 is made of dielectric ceramics having a relative dielectric constant of 5 to 20. If the relative dielectric constant of the dielectric ceramics exceeds 20, the height L becomes small, a volume of the dielectric block 2 also becomes small, and a retained amount of electric energy becomes small, therefore there is a tendency that the no-load Q value of the resonator becomes small and the insertion loss becomes large. Further, dimensional accuracy is strictly required for the dielectric block, and there is a tendency that difficulty in processing increases, manufacturing cost increases, and it becomes impractical. On the other hand, if the relative dielectric constant of the dielectric ceramics becomes smaller than 5, the height L becomes large and the outer shape dimensions of the dielectric block 2 becomes large, size, weight and a manufacturing cost of the dielectric block become close to a reentrant coaxial or cylindrical cavity resonator, therefore the dielectric resonator tends to become impractical.

A thermal conductivity of the dielectric ceramics composing the dielectric block 2 is preferably 3 to 50 W/(m·K), and is 3 to 30 W/(m·K), for example. With the thermal conductivity equal to or higher than 3 W/(m·K), the dielectric filter can carry out more favorable heat release, and a temperature increase can be restricted. Although the thermal conductivity of the dielectric block 2 is higher the better, the thermal conductivity of a material obtained practically is around 30 W/(m·K) at the maximum.

In addition, a specific heat of the dielectric ceramics composing the dielectric block 2 is preferably 600 J/(kg·K) or higher. With the specific heat equal to or higher than 600 J/(kg·K), the dielectric filter can restrict a temperature increase.

As the dielectric ceramics having the above characteristics, there is alumina-based ceramics having a composition containing 40 mol % or more of $Al_2O_3$ as major components. By using the alumina-based ceramics, the no-load Q value of the resonator composing the filter can be increased to 1000 or more, for example. As such alumina-based ceramics, for example, there is one having, as a major component, a composition consisting of aluminum, zirconium, titanium, tin, and oxygen expressed by a composition formula $aAl_2O_3$-$bZrO_2$-$cTiO_2$-$dSnO_2$ (In the formula, $0.4068 < a < 0.9550$, $0 < b < 0.1483$, $0.0225 < c < 0.3263$, $0.0203 < d < 0.1186$, $a+b+c+d=1$) described in the above Patent Document 5. A relative dielectric constant of this dielectric ceramics is 10 to 20.

By using the dielectric ceramics as described above, it becomes easy to manufacture the dielectric filter for base station communication equipment that has the no-load Q value of the resonator as high as 1000 or more, and the insertion loss of 0.8 dB or lower or preferably 0.5 dB or lower, is capable of high power of 10 to 50 W, is capable of being mass-produced, and is practical.

The dielectric filter for base station communication equipment according to the present embodiment can be suitably used in a frequency band 1.5 to 4 GHz. As a system using such a frequency band, there are GPS: Global Positioning System, PCS: Personal Communication Services, DCS: Digital Communication System, UMTS: Universal Mobile Telecommunications System, LAN: Local Area Network 2.5 GHz, Wimax: Worldwide Interoperability for Microwave Access 2.5 GHz, Wimax 3.5 GHz, and so on.

As a frequency becomes higher, the height L of the dielectric block 2 becomes small. When the height L becomes too small with respect to the width H, a favorable resonator no-load Q value tends not to be obtained. On the other hand, as a frequency becomes lower, the height L of the dielectric block 2 becomes large. When the height L becomes too large with respect to the width H, a favorable resonator no-load Q value tends not to be obtained. In the present embodiment, the width H of the dielectric block 2 is set to be 10 to 30 mm with respect to the frequency band 1.5 to 4 GHz, and in this manner, relationship between the width H and the height L can be properly maintained, and a favorable resonator no-load Q value can be obtained. One example is that the width H of the dielectric block 2 is set to be 14.4 mm is shown below. That is, in case that a relative dielectric constant of the dielectric ceramics used for the dielectric block 2 is 5, the height L is 22.4 mm when the frequency is 1.5 GHz, and the height L is 8.4 mm when the frequency is 4 GHz. In addition, in case the relative dielectric constant of the dielectric ceramics is 20, the height L is 11.2 mm when the frequency is 1.5 GHz, and the height L is 4.2 mm when the frequency is 4 GHz.

EXAMPLE

Example 1

By using the alumina-based ceramics disclosed in the Patent Document 5 and having a composition of $0.7778Al_2O_3\text{-}0.0111ZrO_2\text{-}0.1111TiO_2\text{-}0.1SnO_2$ as the dielectric ceramics, the dielectric filter for base station communication equipment shown in FIG. 1 and FIG. 2 was manufactured.

The relative dielectric constant of the dielectric ceramics was 13, the thermal conductivity thereof was 14.1 W/(m·K), the specific heat thereof was 700 J/(kg·K), and the material Q value thereof was 45000. The dielectric block 2 was set to have the length (W) of 62.0 mm, the width (H) of 14.4 mm, and the height (L) of 8.0 mm. The pass band for the transmission side filter section 1B was set to be 2110 to 2170 MHz, and the pass band for the reception side filter section 1A was set to be 1920 to 1980 MHz. A cross-sectional shape and dimensions of the through-hole 4 of each of the resonators, resonator allocation such as distance between the through-holes 4 of the resonators adjacent to each other, and further a shape of the patterned conductive film 9A, and so on, were set so that a best filter characteristic can be obtained. The no-load Q value of the resonator was around 1250.

Figure 3:
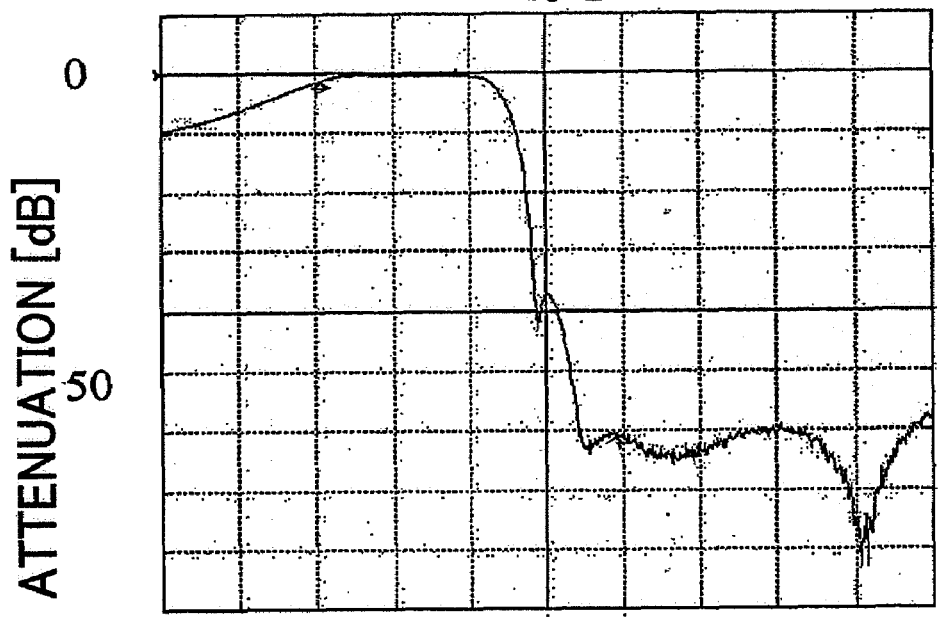
FIG. 3 is a frequency characteristic diagram of a reception side filter section of the dielectric filter obtained in Example 1.
Figure 4:
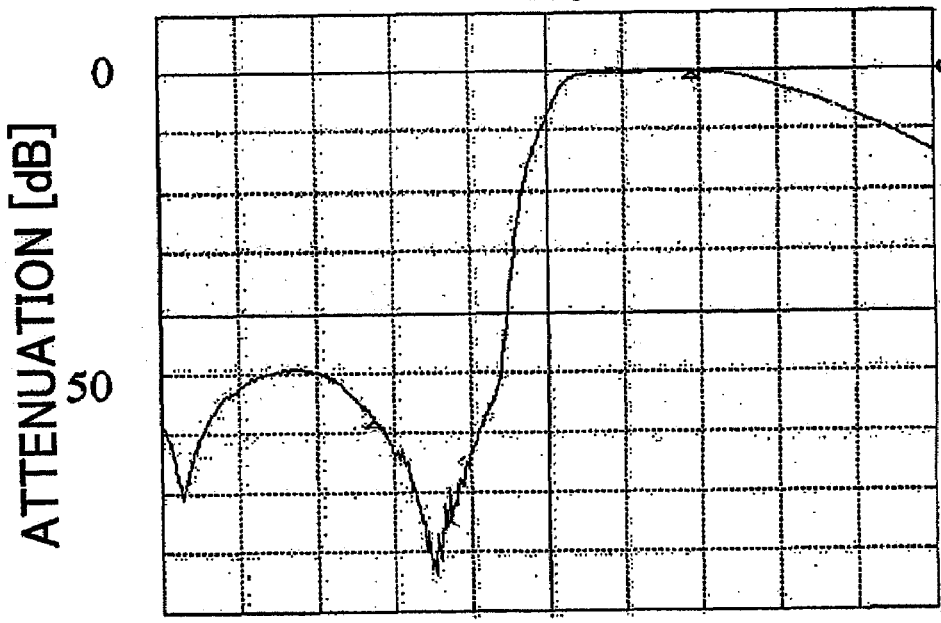
FIG. 4 is a frequency characteristic diagram of a transmission side filter section of the dielectric filter obtained in Example 1.

A frequency characteristic diagram of the manufactured dielectric filter for base station communication equipment is shown in FIG. 3 (reception side) and FIG. 4 (transmission side). In the transmission side filter section 1B, an insertion loss in the pass band of 2110 to 2170 MHz was 0.43 dB, and attenuation in the rejection band of 1920 to 1980 MHz was 57 dB. In the reception side filter section 1A, an insertion loss in the pass band of 1920 to 1980 MHz was 0.47 dB, and attenuation in the rejection band of 2110 to 2170 MHz was 61 dB. The insertion loss in each of the pass bands is sufficiently small, and the attenuation in each of the rejection band is sufficiently large. Table 1 puts together and shows dimensions of the dielectric block, a characteristic of the dielectric ceramics, and an electric characteristic of the filter.

As power is applied to the dielectric filter in order to obtain an output power of 50 W, a temperature of the filter at a location with the highest temperature was around 90° C. Due to this heat generation, the insertion loss in the pass band of the transmission side filter section 1B increased for 0.1 dB.

Comparative Example 1

By using $BaTiO_3$-based ceramics disclosed in the Patent Document 4 and having a composition of $0.185BaO\text{-}0.815TiO_2\text{-}0.005MnO\text{-}0.005SbO_{3/2}$ as the dielectric ceramics, the dielectric filter for base station communication equipment shown in FIG. 1 and FIG. 2 was manufactured.

Figure 5:
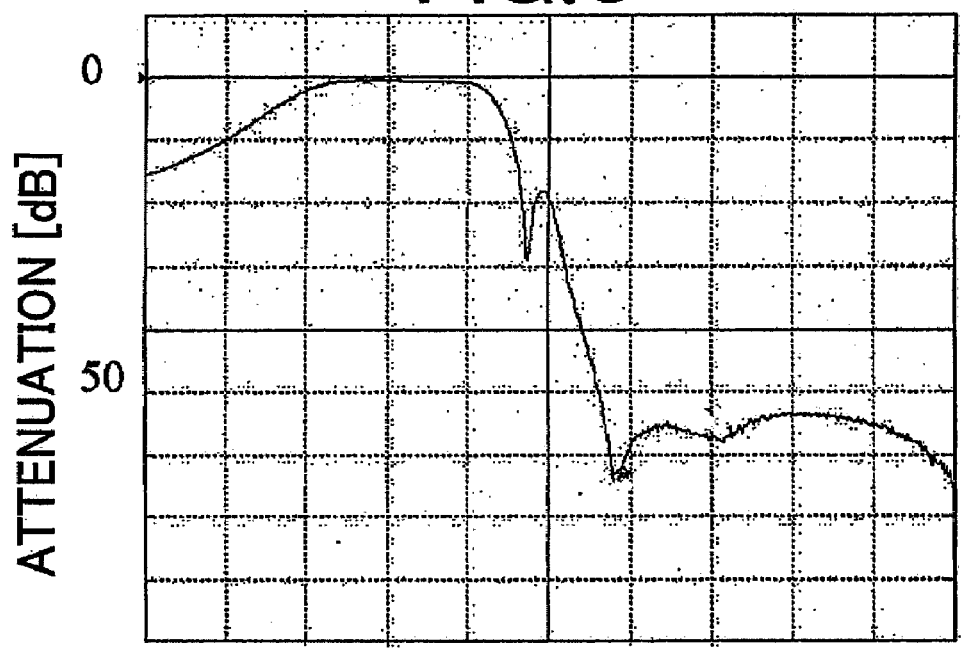
FIG. 5 is a frequency characteristic diagram of a reception side filter section of the dielectric filter obtained in Comparative Example 1.
Figure 6:
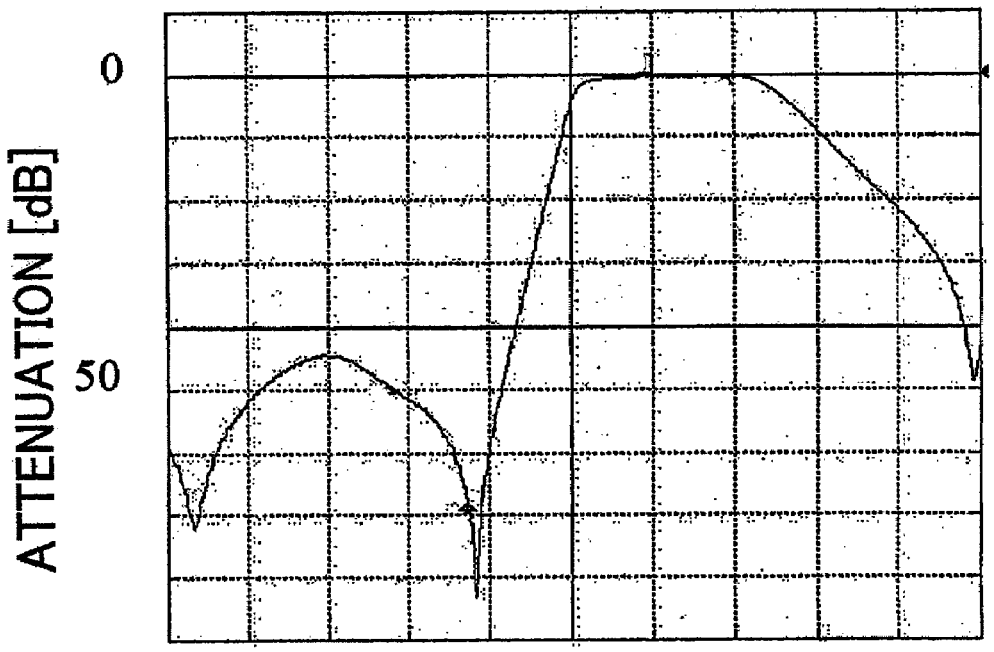
FIG. 6 is a frequency characteristic diagram of a transmission side filter section of the dielectric filter obtained in Comparative Example 1.

The relative dielectric constant of the dielectric ceramics was 38, the thermal conductivity thereof was 2.1 W/(m·K), the specific heat thereof was 572 J/(kg·K), and the material Q value thereof was 40000. The dielectric block 2 was set to have the length (W) of 62.0 mm, the width (H) of 14.4 mm, and the height (L) of 4.7 mm. The pass band for the transmission side filter section 1B was set to be 2110 to 2170 MHz, and the pass band for the reception side filter section 1A was set to be 1920 to 1980 MHz. A cross-sectional shape and dimensions of the through-hole 4 of each of the resonators, resonator allocation such as distance between the through-holes 4 of the resonators adjacent to each other, and further a shape of the patterned conductive film 9A, and so on, were set so that a best filter characteristic can be obtained, A frequency characteristic diagram of the manufactured dielectric filter for base station communication equipment is shown in FIG. 5 (reception side) and FIG. 6 (transmission side). In the transmission side filter section 1B, an insertion loss in the pass band of 2110 to 2170 MHz was 0.57 dB, and attenuation in the rejection band of 1920 to 1980 MHz was 49 dB. In the reception side filter section 1A, an insertion loss in the pass band of 1920 to 1980 MHz was 0.81 dB, and attenuation in the rejection band of 2110 to 2170 MHz was 55 dB. Although the attenuation in each of the rejection band is sufficiently large, the insertion loss in each of the pass bands is not sufficiently small, and especially the insertion loss in the pass band of the reception side filter section 1A is large. Table 1 puts together and shows dimensions of the dielectric block, a characteristic of the dielectric ceramics, and an electric characteristic of the filter.

As power is applied to the dielectric filter in order to obtain an output power of 50 W, a temperature of the filter at a location with the highest temperature was around 150° C. Due to this heat generation, the insertion loss in the pass band of the transmission side filter section 1B increased for 0.2 dB.

Comparative Example 2

The dielectric filter for base station communication equipment shown in FIG. 1 and FIG. 2 was manufactured in a similar manner as Example 1, except that the length (W) of the dielectric block 2 was set to be 35.0 mm and the width (H) thereof was set to be 6.1 mm.

The pass band for the transmission side filter section 1B was set to be 2110 to 2170 MHz, and the pass band for the reception side filter section 1A was set to be 1920 to 1980 MHz. A cross-sectional shape and dimensions of the through-hole 4 of each of the resonators, resonator allocation such as distance between the through-holes 4 of the resonators adjacent to each other, and further a shape of the patterned conductive film 9A, and so on, were set so that a best filter characteristic can be obtained. The no-load Q value of the resonator was around 800.

Figure 7:
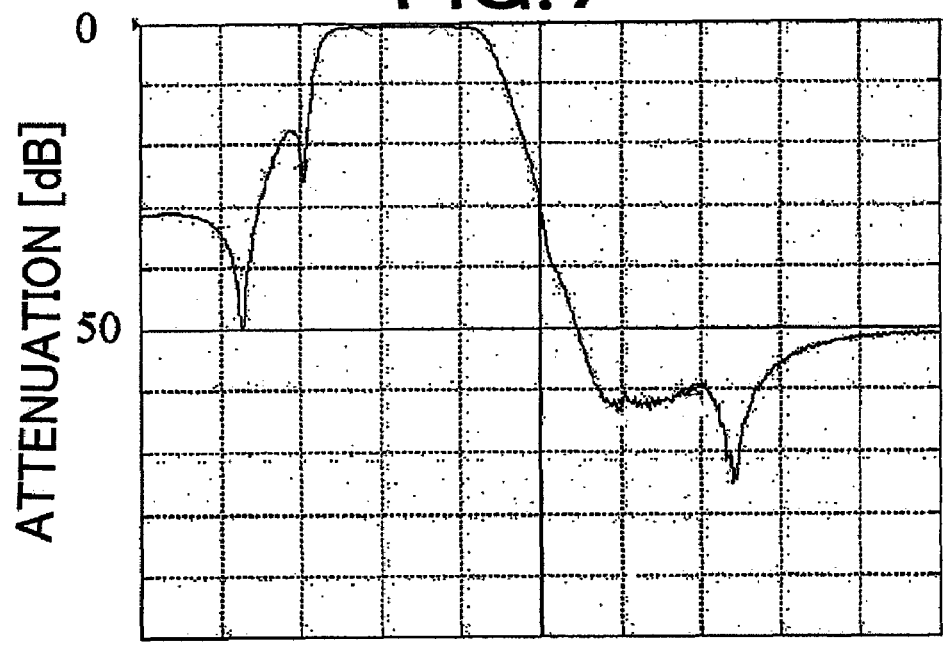
FIG. 7 is a frequency characteristic diagram of a reception side filter section of the dielectric filter obtained in Comparative Example 2.
Figure 8:
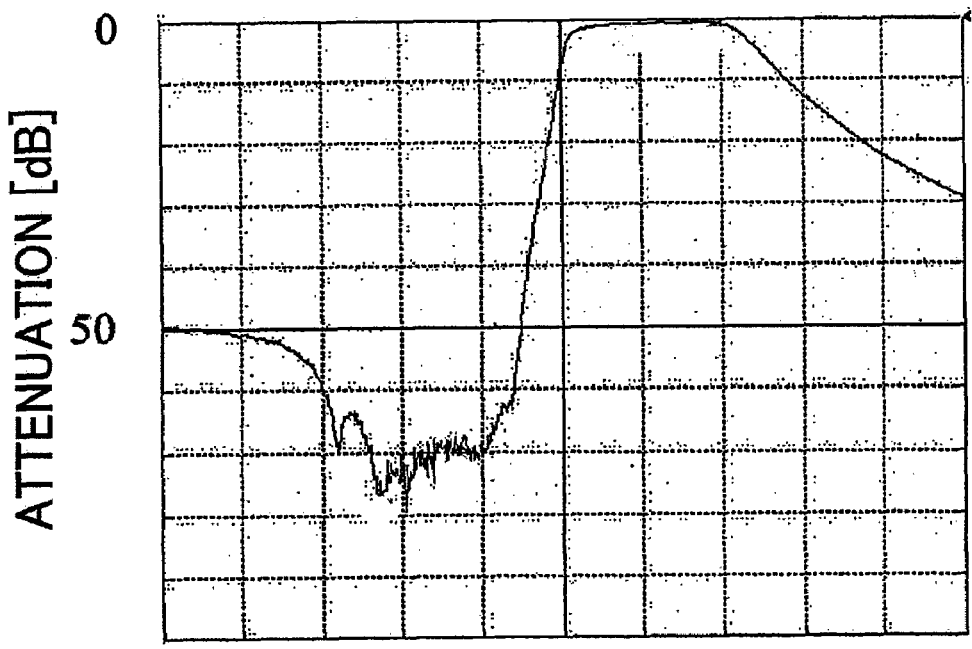
FIG. 8 is a frequency characteristic diagram of a transmission side filter section of the dielectric filter obtained in Comparative Example 2.

A frequency characteristic diagram of the manufactured dielectric filter for base station communication equipment is shown in FIG. 7 (reception side) and FIG. 8 (transmission side). In the transmission side filter section 1B, an insertion loss in the pass band of 2110 to 2170 MHz was 0.71 dB, and attenuation in the rejection band of 1920 to 1980 MHz was 68 dB. In the reception side filter section 1A, an insertion loss in the pass band of 1920 to 1980 MHz was 0.77 dB, and attenuation in the rejection band of 2110 to 2170 MHz was 60 dB. The insertion loss in each of the pass bands is not sufficiently small and, although the attenuation in the rejection band of the reception side filter section 1A is sufficiently large, the attenuation in the rejection band of the transmission side filter section 1B is not sufficiently large. Table 1 puts together and shows dimensions of the dielectric block, a characteristic of the dielectric ceramics, and an electric characteristic of the filter.

Comparative Example 3

The dielectric filter for base station communication equipment shown in FIG. 1 and FIG. 2 was manufactured in a similar manner as Comparative Example 1, except that the length (W) of the dielectric block 2 was set to be 35.0 mm, the width (H) thereof was set to be 6.1 mm, and the height (L) thereof was set to be 5.0 mm.

The pass band for the transmission side filter section 1B was set to be 2110 to 2170 MHz, and the pass band for the reception side filter section 1A was set to be 1920 to 1980 MHz. A cross-sectional shape and dimensions of the through-hole 4 of each of the resonators, resonator allocation such as distance between the through-holes 4 of the resonators adjacent to each other, and further a shape of the patterned conductive film 9A, and so on, were set so that a best filter characteristic can be obtained.

Figure 9:
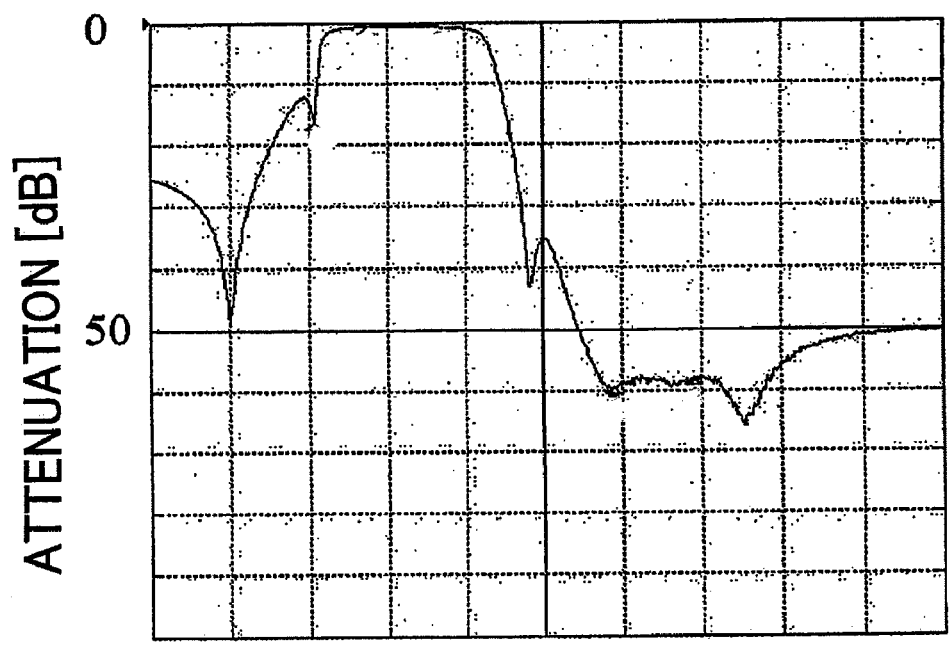
FIG. 9 is a frequency characteristic diagram of a reception side filter section of the dielectric filter obtained in Comparative Example 3.
Figure 10:
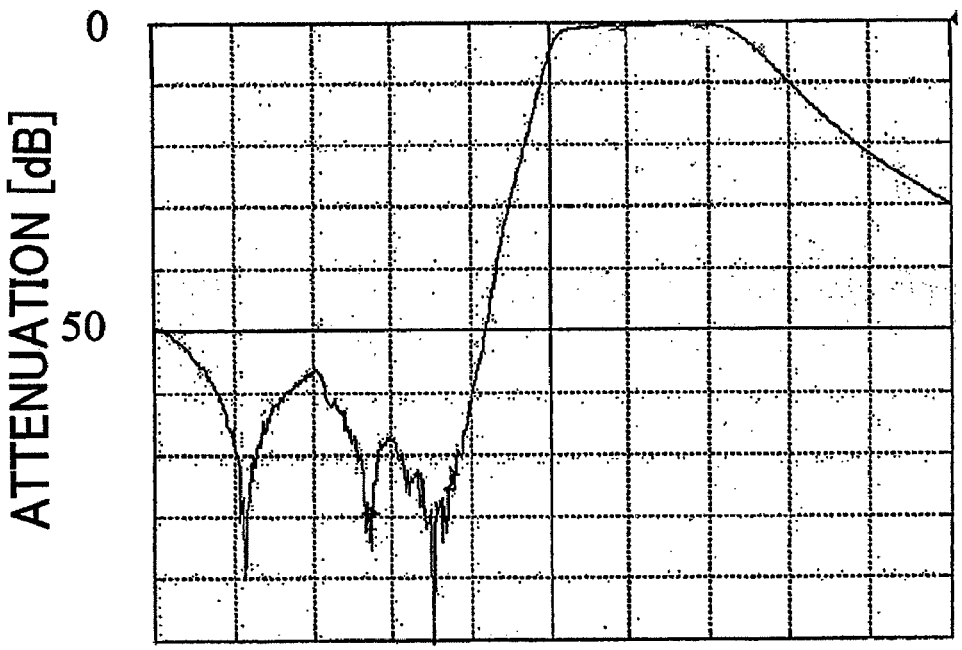
FIG. 10 is a frequency characteristic diagram of a transmission side filter section of the dielectric filter obtained in Comparative Example 3.

A frequency characteristic diagram of the manufactured dielectric filter for base station communication equipment is shown in FIG. 9 (reception side) and FIG. 10 (transmission side). In the transmission side filter section 1B, an insertion loss in the pass band of 2110 to 2170 MHz was 0.71 dB, and attenuation in the rejection band of 1920 to 1980 MHz was 67 dB. In the reception side filter section 1A, an insertion loss in the pass band of 1920 to 1980 MHz was 0.87 dB, and attenuation in the rejection band of 2110 to 2170 MHz was 57 dB. The insertion loss in each of the pass bands is not sufficiently small and especially the insertion loss in the pass band of the reception side filter section 1A is large and, although the attenuation in the rejection band of the reception side filter section 1A is sufficiently large, the attenuation in the rejection band of the transmission side filter section 1B is not sufficiently large. Table 1 puts together and shows dimensions of the dielectric block, a characteristic of the dielectric ceramics, and an electric characteristic of the filter.

TABLE 1

| | | Example 1 | Comp. Example 1 | Comp. Example 2 | Comp. Example 3 |
|---|---|---|---|---|---|
| Dimensions of Dielectric Block | W [mm] | 62.0 | 62.0 | 35.0 | 35.0 |
| | H [mm] | 14.4 | 14.4 | 6.1 | 6.1 |
| | L [mm] | 8.0 | 4.7 | 8.0 | 5.0 |
| Characteristic of Dielectric Ceramics | Relative Dielectric Constant | 13 | 38 | 13 | 38 |
| | Thermal Conductivity [W/(m·K)] | 14.1 | 2.1 | 14.1 | 2.1 |
| | Specific Heat [J/(kg·K)] | 700 | 572 | 700 | 572 |
| Characteristic of Filter | Transmission Side Pass Band Insertion Loss [dB] | 0.43 | 0.57 | 0.71 | 0.71 |
| | Rejection Band Attenuation [dB] | 57 | 49 | 68 | 67 |
| | Reception Side Pass Band Insertion Loss [dB] | 0.47 | 0.81 | 0.77 | 0.87 |
| | Rejection Band Attenuation [dB] | 61 | 55 | 60 | 57 |

As described above, it is understandable that, in Comparative Examples 1 to 3 in which combinations of the width (H) of the dielectric block and the relative dielectric constant of the dielectric ceramics are out of the range specified in the present invention, a low insertion loss is not obtained. In particular, as a comparison between Comparative Example 1 and Example 1 shows, in the dielectric filter that uses the dielectric block with H=14.4 mm, in case that the dielectric ceramics having the relative dielectric constant 38 is replaced by one having the relative dielectric constant 13, the insertion loss in the pass band (1920 to 1980 MHz) on the reception side significantly improves from 0.81 dB to 0.47 dB. On the other hand, as a comparison between Comparative Example 3 and Comparative Example 2 shows, in the dielectric filter that uses the dielectric block with H=6.1 mm, in case that the dielectric ceramics having the relative dielectric constant 38 is replaced by one having the relative dielectric constant 13, the insertion loss in the pass band (1920 to 1980 MHz) on the reception side merely changes a little from 0.87 dB to 0.77 dB. As such, the dielectric filter of base station communication equipment according to the present invention cannot be achieved only by using mere dielectric ceramics having a small relative dielectric constant, but was achieved finally by a combination of such dielectric ceramics and dimensions of the dielectric block.

In addition, as to a heat release characteristic, the following is understandable. That is, in Example 1, the dielectric ceramics having the thermal conductivity of 14.1 W/(m·K) and the specific heat of 700 J/(kg·K) is used, therefore a temperature increase is small at the time of heat generation and heat can be dissipated to a mount substrate side efficiently. For this reason, lowering of an electric conductivity of a conductive film due to heat is restricted, and an electric characteristic of high performance of the filter can be maintained. On the other hand, in Comparative Example 1, the dielectric ceramics having the thermal conductivity of 2.1 W/(m·K) and the specific heat of 572 J/(kg·K) is used, therefore a temperature increase is not small at the time of heat generation and heat cannot be dissipated to the mount substrate side efficiently. For this reason, the electric conductivity of the conductive film lowers due to heat, and a favorable electric characteristic of the filter is hard to maintain.

In the above-described Example 1, one with a specific composition of the alumina-based ceramics disclosed in Patent Document 5 described above is used. However, even in a case where, in a composition formula $aAl_2O_3$-$bZrO_2$-$cTiO_2$-$dSnO_2$, values of a, b, c and d are changed in a predetermined range, there was no change with respect to that the material Q value was 5000 or higher, the thermal conductivity was 3 to 50 W/(m·K), and the specific heat was 600 J/(kg·K) or larger. In addition, by these as well, the dielectric filter for base station communication equipment capable of the no-load Q value of the resonators of 1000 or higher, the insertion loss of 0.8 dB or lower, and high power with output of 10 to 50 W could be manufactured.

What is claimed is:

1. A dielectric filter for base station communication equipment suitable for use in a frequency band of 1.5 to 4 GHz, comprising:
    a dielectric block of a substantially rectangular solid shape having a side surface;
    a plurality of ¼ wavelength resonators, which are arranged along the length of the dielectric block, and extend so as to be substantially parallel to the side surface and substantially parallel to each other,
    wherein the dielectric block is comprised of dielectric ceramics having a relative dielectric constant of 5 to 20, and a dimension of the dielectric block in a direction orthogonally intersecting with the side surface of the dielectric block is 10 to 30 mm.

2. The dielectric filter as claimed in claim 1, wherein an insertion loss of the dielectric filter is 0.8 dB or less.

3. The dielectric filter as claimed in claim 1, wherein an output of the dielectric filter is 10 to 50 W.

4. The dielectric filter as claimed in claim 1, wherein the dielectric ceramics has a material Q value of 5000 or higher.

5. The dielectric filter as claimed in claim 1, wherein the dielectric ceramics has a thermal conductivity of 3 to 50 W/(mK).

6. The dielectric filter as claimed in claim 1, wherein the dielectric ceramics has a specific heat of 600 J/(kgK) or higher.

7. The dielectric filter as claimed in claim 1, wherein the dielectric ceramics is alumina-based ceramics having a composition containing 40 mol % or more of $Al_2O_3$ as a major component.

8. The dielectric filter as claimed in claim 1, wherein the dielectric ceramics is alumina-based ceramics having, as a major component, a composition consisting of aluminum, zirconium, titanium, tin, and oxygen expressed by a composition formula $aAl_2O_3$-$bZrO_2$-$cTiO_2$-$dSnO_2$, wherein $0.4068<a<0.9550$, $0<b<0.1483$, $0.0225<c<0.3263$, $0.0203<d<0.1186$, and $a+b+c+d=1$.

* * * * *